US012255147B2

(12) United States Patent
Ecton et al.

(10) Patent No.: US 12,255,147 B2
(45) Date of Patent: Mar. 18, 2025

(54) ELECTRONIC SUBSTRATE HAVING AN EMBEDDED ETCH STOP TO CONTROL CAVITY DEPTH IN GLASS LAYERS THEREIN

(71) Applicant: Intel Corporation, Santa Clara, CA (US)

(72) Inventors: Jeremy Ecton, Gilbert, AZ (US); Brandon Marin, Gilbert, AZ (US); Srinivas Pietambaram, Chandler, AZ (US); Suddhasattwa Nad, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 812 days.

(21) Appl. No.: 17/243,784

(22) Filed: Apr. 29, 2021

(65) Prior Publication Data

US 2022/0352076 A1 Nov. 3, 2022

(51) Int. Cl.
*H01L 23/538* (2006.01)
*H01L 23/00* (2006.01)
*H01L 23/498* (2006.01)
*H01L 25/065* (2023.01)

(52) U.S. Cl.
CPC .... *H01L 23/5383* (2013.01); *H01L 23/49894* (2013.01); *H01L 24/16* (2013.01); *H01L 25/0655* (2013.01); *H01L 2224/16227* (2013.01)

(58) Field of Classification Search
CPC ............. H01L 23/5383; H01L 23/5385; H01L 23/583; H01L 23/5389; H01L 23/15;
(Continued)

(56) References Cited

U.S. PATENT DOCUMENTS 6,221,542 B1 4/2001 Reinberg
6,399,512 B1 6/2002 Blosse et al.
(Continued)

FOREIGN PATENT DOCUMENTS

JP 3730539 1/2006
KR 100802226 2/2008

OTHER PUBLICATIONS

International Search Report and Written Opinion for PCT Application No. PCT/US2022/020302, dated Jul. 4, 2022.
(Continued)

*Primary Examiner* — Dale E Page
*Assistant Examiner* — Lawrence C Tynes, Jr.
(74) *Attorney, Agent, or Firm* — Essential Patents Group, LLP

(57) ABSTRACT

An electronic substrate may be fabricated having at least two glass layers separated by an etch stop layer, wherein a bridge is embedded within one of the glass layers. The depth of a cavity formed for embedding the bridge is control by the thickness of the glass layer rather than by controlling the etching process used to form the cavity, which allows for greater precision in the fabrication of the electronic substrate. In an embodiment of the present description, an integrated circuit package may be formed with the electronic substrate, wherein at least two integrated circuit devices may be attached to the electronic substrate, such that the bridge provides device-to-device interconnection between the at least two integrated circuit devices. In a further embodiment, the integrated circuit package may be electrically attached to an electronic board.

24 Claims, 17 Drawing Sheets

(58) Field of Classification Search
CPC ..... H01L 2924/15153; H01L 27/14636; H01L 2224/21; H01L 2224/766; H01L 2224/821; H01L 2224/24; H01L 2224/25; H01L 2224/19; H01L 2224/92124; H01L 2224/92132; H01L 2224/92144; H01L 2224/92164; H01L 2224/92174; H01L 2224/92224; H01L 2224/92244; H01L 2224/20; H01L 2224/23; H01L 2224/24226; H01L 2224/24246; H01L 2224/18; H01L 2924/18162; H01L 24/24; H01L 24/25; H01L 24/19; H01L 24/20; H01L 24/23; H01L 2221/68359; H01L 2225/1035; H04L 2012/40234; H01H 2011/065

See application file for complete search history.

(56) References Cited

U.S. PATENT DOCUMENTS

| | | | | |
|---|---|---|---|---|
| 6,566,258 | B1* | 5/2003 | Dixit | H01L 21/76801 |
| | | | | 438/692 |
| 10,510,667 | B2* | 12/2019 | Weng | H01L 23/552 |
| 10,757,809 | B1* | 8/2020 | McPartland | H05K 1/0203 |
| 2002/0011907 | A1* | 1/2002 | Yamada | H01L 23/5385 |
| | | | | 333/204 |
| 2005/0184397 | A1* | 8/2005 | Gates | H01L 23/5222 |
| | | | | 257/774 |
| 2007/0072420 | A1 | 3/2007 | Shin | |
| 2008/0268641 | A1 | 10/2008 | Lee et al. | |
| 2017/0358467 | A1* | 12/2017 | Chang | H01L 24/19 |
| 2018/0005949 | A1* | 1/2018 | Lin | H05K 3/36 |
| 2019/0067089 | A1 | 2/2019 | Yang et al. | |
| 2019/0194511 | A1* | 6/2019 | Park | C09J 133/08 |
| 2019/0311916 | A1* | 10/2019 | Chavali | H01L 23/5389 |
| 2020/0335443 | A1* | 10/2020 | Sun Zhou | H01L 21/4857 |
| 2022/0199575 | A1* | 6/2022 | Karhade | H01L 24/81 |
| 2022/0262766 | A1* | 8/2022 | Chen | H01L 23/5389 |

OTHER PUBLICATIONS

International Preliminary Report on Patentability from PCT/US2022/020302 notified Nov. 9, 2023, 7 pgs.

\* cited by examiner

ELECTRONIC SUBSTRATE HAVING AN EMBEDDED ETCH STOP TO CONTROL CAVITY DEPTH IN GLASS LAYERS THEREIN

TECHNICAL FIELD

Embodiments of the present description generally relate to the field of integrated circuit package fabrication, and, more specifically, to an integrated circuit assembly including an electronic substrate having a bridge for electrical signal connection between integrated circuit devices, wherein the bridge is embedded in a glass layer of the electronic substrate.

BACKGROUND

The integrated circuit industry is continually striving to produce ever faster, smaller, and thinner integrated circuit packages for use in various electronic products, including, but not limited to, computer servers and portable products, such as portable computers, electronic tablets, cellular phones, digital cameras, and the like.

As a part of this effort, integrated circuit packages containing multiple integrated circuit devices, such as microelectronic dice, have been developed. These multiple integrated circuit device packages are referred to in the art as multi-device, multi-chip packages (MCPs), or partitioned devices, and offer the potential for increased architectural flexibility at reduced cost, but must do so such that appropriate integrated circuit device-to-integrated circuit device interconnect densities are provided. As will be understood to those skilled in the art, interconnect density is an important consideration because an insufficient number of integrated circuit device connections would limit the bandwidth capability for the affected integrated circuit device interface, and thus would reduce the communication efficiency and capability between integrated circuit devices.

To address interconnection concerns, a bridge may be embedded in a substrate to which the integrated circuit devices are attached. These bridges support dense integrated circuit device-to-integrated circuit device interconnects, such as from a first integrated circuit device edge to a second integrated circuit device edge, and may support a number of signal lines through the bridge itself. Instead of using an expensive silicon interposer with through silicon vias, the bridge may be an inactive silicon structure or an active silicon device that is embedded in the substrate, enabling the dense integrated circuit device-to-integrated circuit device interconnects only where needed. Standard flip-chip processes may be used to connect the integrated circuit devices to the substrate for robust power delivery and to the bridge within the substrate. Thus, a resulting integrated circuit package may be considerably smaller than an integrated circuit package that is only interconnected with conductive routes within the substrate.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
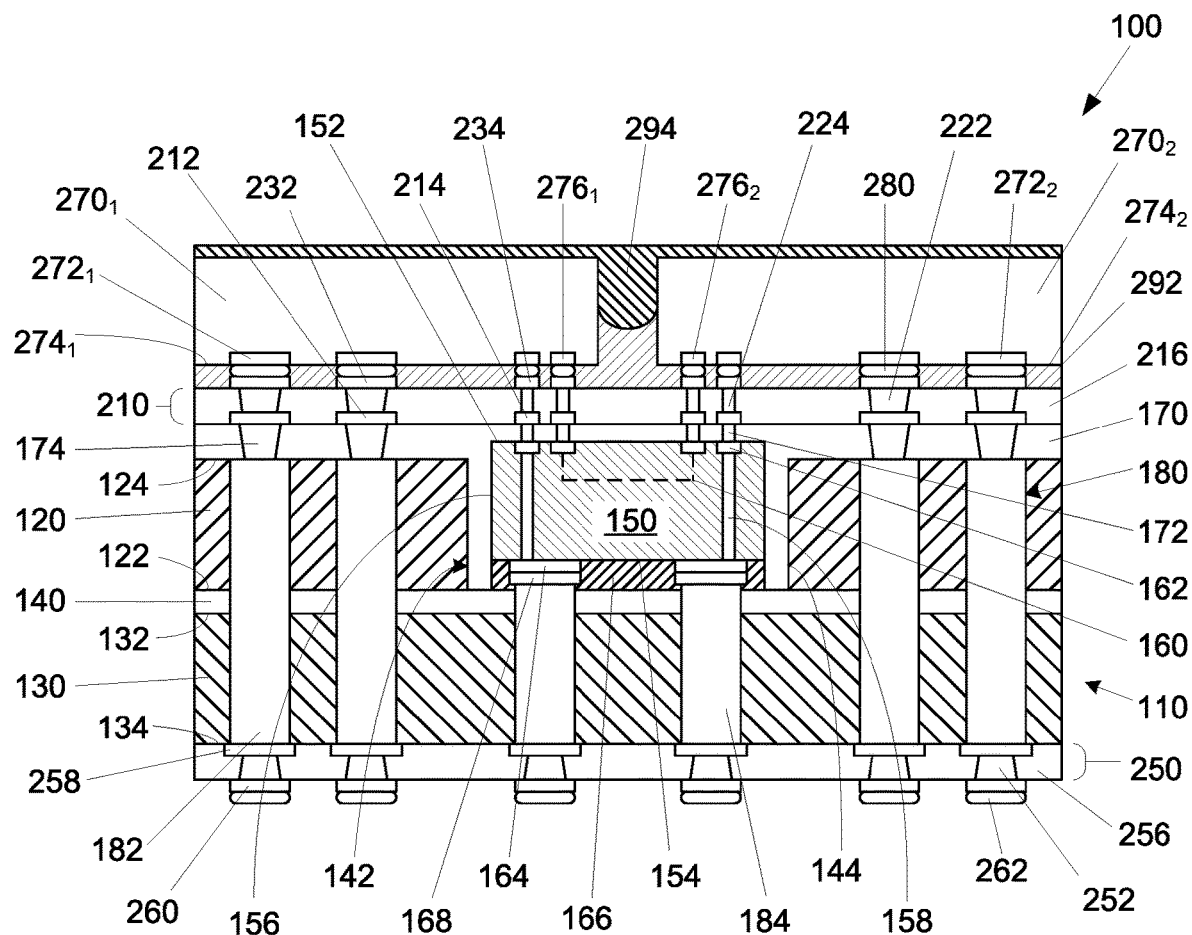
FIG. 1 is a side cross-sectional view of an integrated circuit package, according to one embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-boned interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures. as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

As previously discussed, the integrated circuit industry, in order to reduce the size of integrated circuit packages and components, is utilizing bridges embedded within electronic substrates, such as interposer and patches, to form interconnections between partitioned integrated circuit devices. For future generations of such integrated device partitioning, multiple bridges that can connect the integrated devices at much finer bump pitches (25 microns or lower) than that which can currently be delivered by technologies are needed. As will be understood, current approaches to embedded bridges suffer from high cumulative Bump Thickness Variation (BTV) and as the number of bridges to be embedded increases, the cost of embedding and yields will suffer. Alternate architectures and approaches have been proposed and investigated. However, issues with warpage have arisen with regard to the alternate approaches. To address these issues, at least one substantially rigid glass layer may be incorporated into the electronic substrate, which has resulted in a significant decrease in the warpage. However, such approaches rely on wet etching of glass to define the cavity for the bridge, which exhibits significant and unacceptable cavity depth variation (+/−10%).

Embodiments of the present description include an electronic substrate having at least two glass layers separated by an etch stop layer, wherein a bridge is embedded within one of the glass layers. The depth of a cavity formed for embedding the bridge is control by the thickness of the glass layer rather than by controlling the etching process used to form the cavity, which allows for greater precision in the fabrication of the electronic substrate. In an embodiment of the present description, an integrated circuit package may be formed with the electronic substrate, wherein at least two integrated circuit devices may be attached to the electronic substrate, such that the bridge provides device-to-device interconnection between at least two integrated circuit devices. In a further embodiment, the integrated circuit package may be electrically attached to an electronic board or a package interposer.

An integrated circuit package 100 may be formed by first forming an electronic substrate 110, such as an interposer or patch, as shown in FIG. 1. The electronic substrate 110 may comprise at least two glass layers, illustrated as a first glass layer 120, having a first surface 122 and an opposing second surface 124, and a second glass layer 130, having a first surface 132 and an opposing second surface 134, with an etch stop layer 140 between the first surface 122 of the first glass layer 120 and the first surface 132 of the second glass layer 130.

The first glass layer 120 and the second glass layer 130 may be any appropriate glass material, including, but not limited to, silicate-based glass (lithium-silicate, borosilicate, aluminum silicate, and the like), as well as lower quality soda lime, and high-quality fused silica. As will be understood to those skilled in the art, integrated circuit packages will include materials with various thicknesses and coefficients of thermal expansion (CTE), particularly with regard to the integrated circuit devices, the mold material layers, and even the rigid carrier used to form the integrated circuit packages. A large CTE mismatch between the materials may result in unit level and/or panel level warpage. The first glass layer 120 and the second glass layer 130 may provide rigidity to mitigate such warpage.

The etch stop layer 140 may be any appropriate material relative to an etchant, such as hydrofluoric acid, used to form openings within the first glass layer 120 and the second glass layer 130 in the fabrication of the electronic substrate 110, as will be discussed. In one embodiment of the present description, the etch stop layer 140 is a dielectric material. In an embodiment of the present description, the etch stop layer 140 may comprise a light absorbing material. In a specific embodiment, the etch stop layer 140 may absorb ultraviolet light, particularly when a Laser Induced Deep Etching (LIDE) processing method is utilized, as will be discussed. The etch stop layer 140 may include, but is not limited to, polymers (such as polytetrafluoroethylene, polyethylene, polyvinyl chloride, polyvinylidene fluoride, and ultra-high molecular weight polyethylene) and metal oxides (such as aluminum oxide). Although the etch stop layer 140 is illustrated as a single layer, the embodiments of the present description are not so limited, as the etch stop layer 140 may have a plurality of layers of differing or similar materials.

At least one bridge opening 142 may be formed in at least one of the first glass layer 120 and the second glass layer 130. As illustrated in FIG. 1, the bridge opening 142 may be defined by at least one sidewall 144 extending from the first surface 122 of the first glass layer 120 to the second surface 124 of the first glass layer 120. At least one bridge 150 may be disposed within the bridge opening 142. As illustrated, the at least one bridge 150 may include a first surface 152, an opposing second surface 154, and at least one side 156 extending between the first surface 152 and the second surface 154. The bridge 150 may include at least one device-to-device interconnection route 160 (illustrated as a dashed line) extending between an associated pair of bond pads 162 in or on the first surface 152 of the at least one bridge 150, and may include a plurality of through-bridge conductive vias 158, wherein each of the plurality of through-bridge conductive vias 158 extends between one bond pad 162 in or on the first surface 152 of the bridge 150 and a bond pad 164 in or on the second surface 154 of the bridge 150. The at least one bridge 150 may be attached within the bridge opening 142 with an adhesive layer 166, such as a thermo-bond film, between the second surface 152 of the bridge 150 and the etch stop layer 140. It is noted that an interconnection layer 168 may be formed on the bond pads 164 at the second surface 154 of the bridge 150 to assist in subsequent electrical connection, as will be discussed.

In one embodiment, the bridge 150 may comprise silicon-containing components. As will be understood to those skilled in the art, silicon bridges may be preferred because silicon processing technology is relatively advanced, and interconnect pitches and line widths for the device-to-device interconnection routes 160 that are achievable using existing silicon process technology may be significantly smaller, and thus more dense, than what is possible using currently available technology for copper signal lines in polymer layers, as is common in electronic substrate fabrication.

As further shown in FIG. 1, the bridge 150 may be at least partially encapsulated with a mold material 170, such as an epoxy, disposed within the bridge opening 142. The mold material may extend over the first surface 152 of the bridge 150 and over the second surface 124 of the first glass layer 120. In one embodiment, at least one high-density through-mold conductive via 172 may extend through the mold material 170 and be electrically attached to the bond pads 162 in or on the first surface 152 of the bridge 150.

As shown in FIG. 1, at least one first through-glass conductive via 182 may extend through the first glass layer 120, the second glass layer 130, and the etch stop layer 140. The at least one first through-glass conductive via 182 may comprise at least one through-glass conductive route 180. The at least one first through-glass conductive via 182 may be electrically attached to a corresponding through-mold conductive via 174 proximate the second surface 122 of the first glass layer 120. At least one second through-glass conductive via 184 may extend through the second glass layer 130, the etch stop layer 140, and a portion of the adhesive layer 166, wherein the at least one second through-glass conductive via 184 may be electrically attached to the interconnection layer 168 on corresponding bond pads 164 at the second surface 154 of the bridge 150.

As further shown in FIG. 1, the electronic substrate 110 may include a first signal routing layer 210 formed on the mold material 170. The first signal routing layer 210 may comprise a plurality of conductive traces 212 (including routes and bond pads) on the mold material 170 and electrically coupled with respective through-mold conductive vias 174, and a. plurality of high-density conductive traces 214 (including routes and bond pads) on the mold material 170 and electrically attached with respective high-density through-mold conductive vias 172. The first signal routing layer 210 may further comprise at least one dielectric layer 216, such as a solder resist layer, on the plurality of conductive traces 212, the plurality of high-density conductive traces 214, and the mold material 170. A plurality of conductive vias 222 may be formed to extend through the at least one dielectric layer 216 and electrically attached to a respective conductive trace 212. and a plurality of high-density conductive vias 224 may be formed to extend through the at least one dielectric layer 216 and be electrically attached to a respective high-density conductive trace 214. A plurality of device-to-substrate bond pads 232 may be formed on the at least one dielectric layer 216 and electrically attached to respective conductive vias 222 and a plurality of high-density device-to-substrate bond pads 234 may be formed on the at least one dielectric layer 216 and electrically attached to respective high-density conductive vias 224.

As still further shown in FIG. 1, the electronic substrate 110 may include a second signal routing layer 250 formed on the second surface 134 of the second glass layer 130. The second signal routing layer 250 may comprise at least one dielectric layer 256, such as a solder resist layer, a plurality of conductive traces 258 electrically coupled with at least one of the first through-glass conductive via 182 and the second through-glass conductive 184, and a plurality of conductive vias 252 electrically coupled with respective conductive traces 258. A plurality of substrate-to-board bond pads 260 may be formed on the at least one dielectric layer 256 and electrically attached to respective conductive vias 252. External interconnects 262, such as solder, may be attached to the substrate-to-board pond pads 260. The external interconnects 262 may be used to attach the integrated circuit package 100 to an external substrate (not shown), such as a motherboard. The first signal routing layer 210 and/or the second signal routing layer 250 may comprise a plurality of dielectric material layers, which may include build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, as well as laminates or multiple layers thereof, and the like, as well as low-k and ultra low-k dielectrics (dielectric constants less than about 3.6), including, but not limited to, carbon doped dielectrics, fluorine doped dielectrics, porous dielectrics, organic polymeric dielectrics, and the like. The conductive traces 212, 214, 258, bond pads 232, 260, and the conductive vias 222, 224, and 252 may be made of any appropriate conductive material, including, but not limited to, metals, such as copper, silver, nickel, gold, aluminum, alloys thereof, and the like.

As further shown in FIG. 1, a plurality of integrated circuit devices (illustrated as a first integrated circuit device $270_1$ and a second integrated circuit device $270_2$) may be electrically attached to the electronic substrate 110. The first integrated circuit device $270_1$ and the second integrated circuit device $270_2$ (as well as any further integrated circuit devices that may be utilized) may be any appropriate device, including, but not limited to, a microprocessor, a chipset, a graphics device, a wireless device, a memory device, an application specific integrated circuit device, combinations thereof, stacks thereof, and the like. The first integrated circuit device $270_1$ and the second integrated circuit device $270_2$ may be attached to the electronic substrate 110 through a plurality of device-to-substrate interconnects 280, such as reflowable solder bumps or balls, in a configuration generally known as a flip-chip or controlled collapse chip connection ("C4") configuration. The device-to-substrate interconnects 280 may extend between bond pads $272_1$ on a first surface $274_1$ of the first integrated circuit device $270_1$ and corresponding device-to-substrate bond pads 232, and between the first integrated circuit device bond pads $272_1$ and corresponding high-density device-to-substrate bond pads 234 to form electrical connections therebetween. The device-to-substrate interconnects 280 may also extend between bond pads $272_2$ on a first surface $274_2$ of the second integrated circuit device $270_2$ and corresponding device-to-substrate bond pads 232, and between the second integrated circuit device bond pads $272_2$ and corresponding high-density device-to-substrate bond pads 234 to form electrical connections therebetween. It is understood that the first integrated circuit device bond pads $272_1$ may be in electrical communication with integrated circuitry (not shown) within the first integrated circuit device $270_1$, and that the second integrated circuit device bond pads $272_2$ may be in electrical communication with integrated circuitry (not shown) within the second integrated circuit device $270_2$. The bridge 150 may create an electrical signal connection between the first integrated circuit device $270_1$ and the second integrated circuit device $270_2$ with the at least one device-to-device interconnection route 160 extending between one bond pad 164 of the bridge 150 that is electrically connected to the first integrated circuit device $270_1$ and another bond pad 164 of the bridge 150 that is electrically connected to the second integrated circuit device $270_2$. In an embodiment of the present description, the bridge 150 may be a microprocessor, and the first integrated circuit device $270_1$ and the second integrated circuit device $270_2$ may each be a memory device.

The device-to-substrate interconnects 280 may be any appropriate electrically conductive material or structure, including but not limited to, solder balls, metal bumps or pillars, metal filled epoxies, or a combination thereof. In one embodiment of the present description, the device-to-substrate interconnects 280 may be solder balls formed from tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys). In another embodiment of the present description, the device-to-substrate interconnects 280 may be copper bumps or pillars. In a further embodiment of the present description, the device-to-substrate interconnects 280 may be metal bumps or pillars coated with a solder material.

In one embodiment of the present description, an underfill material 292, such as an epoxy material, may be disposed between the electronic substrate 110 and the integrated circuit devices $270_1$ and $270_2$, and surrounding the plurality of device-to-substrate interconnects 280. As will be understood to those skilled in the art, the underfill material 292 may be dispensed between the first surfaces $272_1$, $272_2$ of the integrated circuit devices $270_1$, $270_2$, respectively, and the electronic substrate 110 as a viscous liquid and then hardened with a curing process. The underfill material 292 may also be a molded underfill material. The underfill material 292 may provide structural integrity and may prevent contamination, as will be understood to those skilled in the art. An encapsulation material 294 may be disposed over and between the integrated circuit devices $270_1$, $270_2$ for further structural integrity and contamination prevention.

Figure 2:
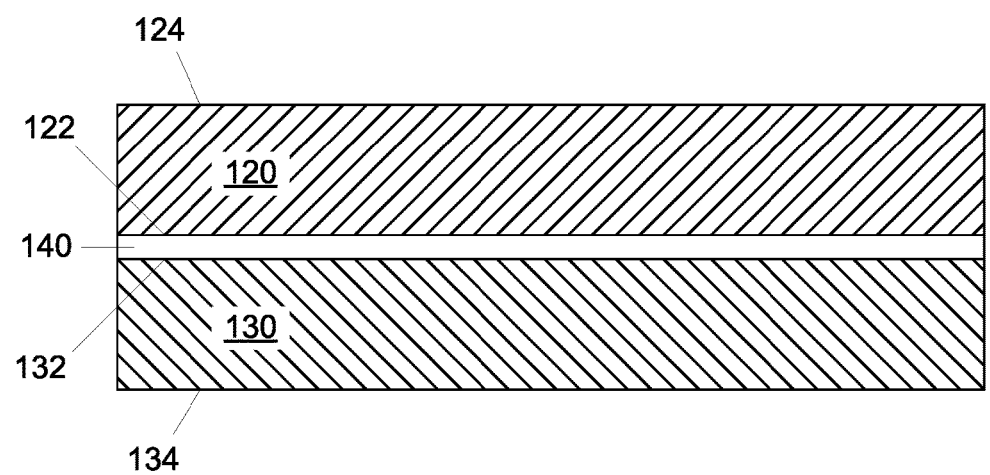
FIGS. 2-12 are side cross-sectional views of a process for fabrication an electronic substrate, according to an embodiment of the present description.
Figure 3:
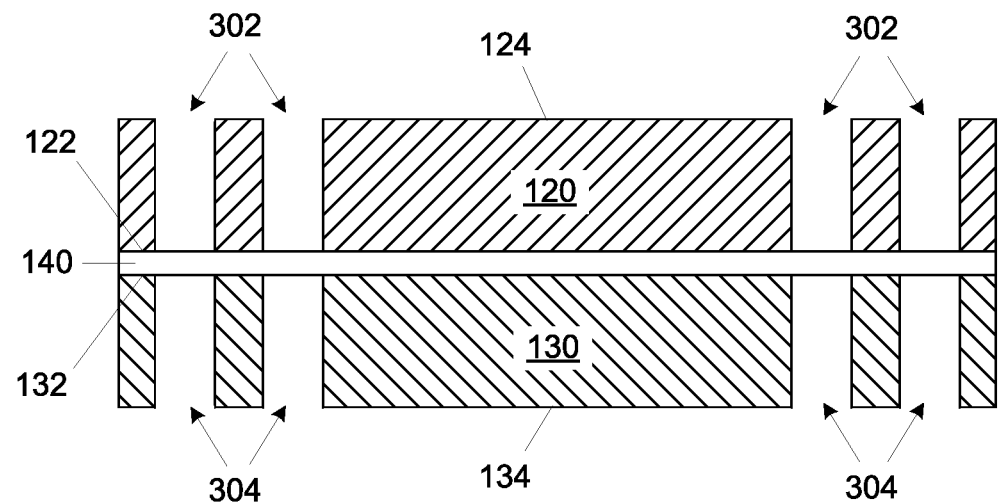

FIGS. 2-12 illustrate one embodiment of the fabrication of the electronic substrate 110 of FIG. 1. As illustrated in FIG. 2, the first glass layer 120 may be attached to the second glass layer 130 with the etch stop layer 140 therebetween. As shown in FIG. 3, at least one opening 302 may be formed in the first glass layer 120, wherein the at least one opening 302 may extend from the second surface 124 of the first glass layer 120 to the first surface 122 of the first glass layer 120 to expose a portion of the etch stop layer 140. As further shown in FIG. 3, at least one opening 304 may be formed in the second glass layer 130, wherein the at least one opening 304 may extend from the second surface 134 of the second glass layer 130 to the first surface 132 of the second glass layer 130 to expose a portion of the etch stop layer 140. The openings 302 in the first glass layer 120 may be paired with corresponding openings 304 in the second glass layer 130, such that they are substantially aligned with one another across the etch stop layer 140.

The openings 302 in the first glass layer 120 and the openings 304 in the second glass layer 130 may be formed by any known process. In one embodiment of the present description, the openings 302 in the first glass layer 120 and the openings 304 in the second glass layer 130 may be formed by a Laser Induced Deep Etching (LIDE) process. The LIDE process is well known in the art and, as such, will not be described in detail, but only in summary, for the sake of clarity and conciseness. The LIDE process is a two-step process for creating deep, high aspect ratio structures in glass. The first step comprises modifying the glass with laser pulses in a desired pattern. The second step comprises removing the modified glass with a wet chemical etch, as the etch chemical will remove the modified glass much more quickly than the unmodified glass. Thus, with the LIDE process, in one embodiment of the present description, the etch stop layer 140 may be made of a material that both absorbs light, such as from an ultraviolet laser, that modifies the glass, and is resistant to the wet etch chemicals that etch the modified glass to form the openings.

Figure 4:
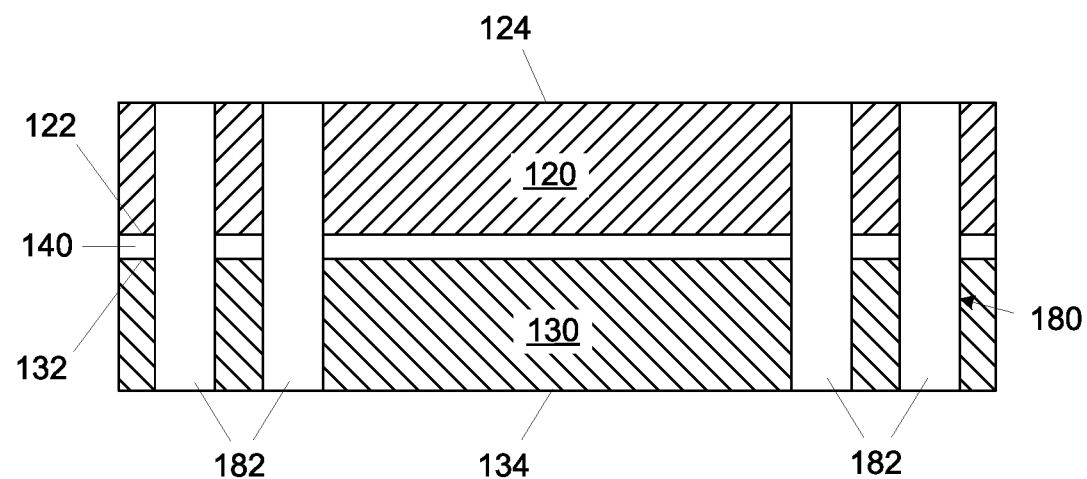

As shown in FIG. 4, portions of the etch stop layer 140 between the openings 302 in the first glass layer 120 and the corresponding openings 304 in the second glass layer 130 may be removed, such as by etching, and a conductive material may be deposited, such as by plating, to form the at least one first through-glass conductive via 182 extending through the first glass layer 120, the second glass layer 130, and the etch stop layer 140.

Figure 5:
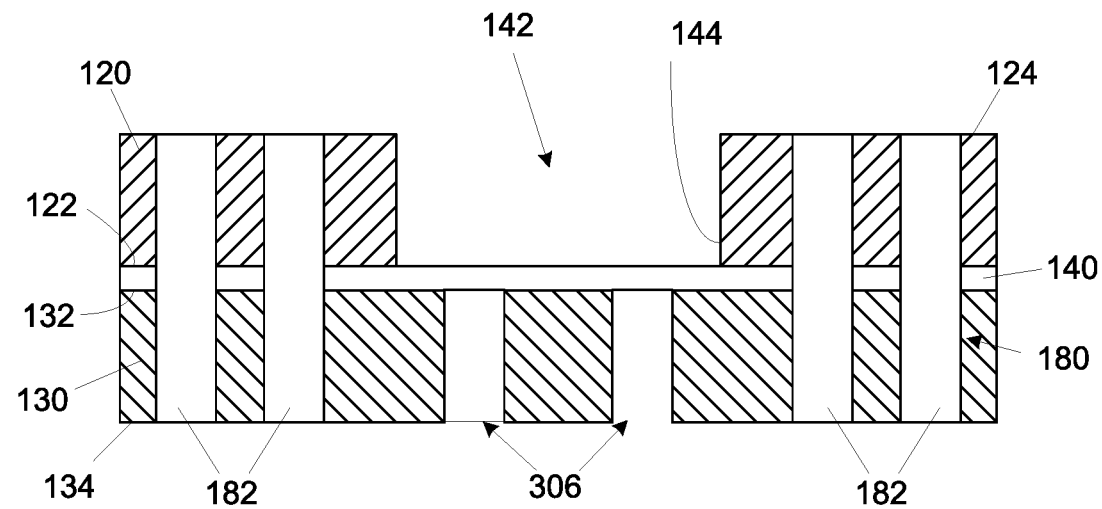

As shown in FIG. 5, the bridge opening 142 may be formed in the first glass layer 120, as previously discussed, which exposes a portion of the etch stop layer 140. In one embodiment of the present description, the bridge opening 142 in the first glass layer 120 may be formed by an LIDE process, as previously discussed.

As further shown in FIG. 5, at least one opening 306 may be formed in the second glass layer 130, wherein the at least one opening 306 may extend from the second surface 134 of the second glass layer 130 to the first surface 132 of the second glass layer 130 to expose the etch stop layer 140. The openings 306 in the second glass layer 130 may be formed to aligned with the bridge opening 142 in the first glass layer 120. In one embodiment of the present description, the openings 306 in the second glass layer 130 may be formed by an LIDE process, as previously discussed.

Figure 6:
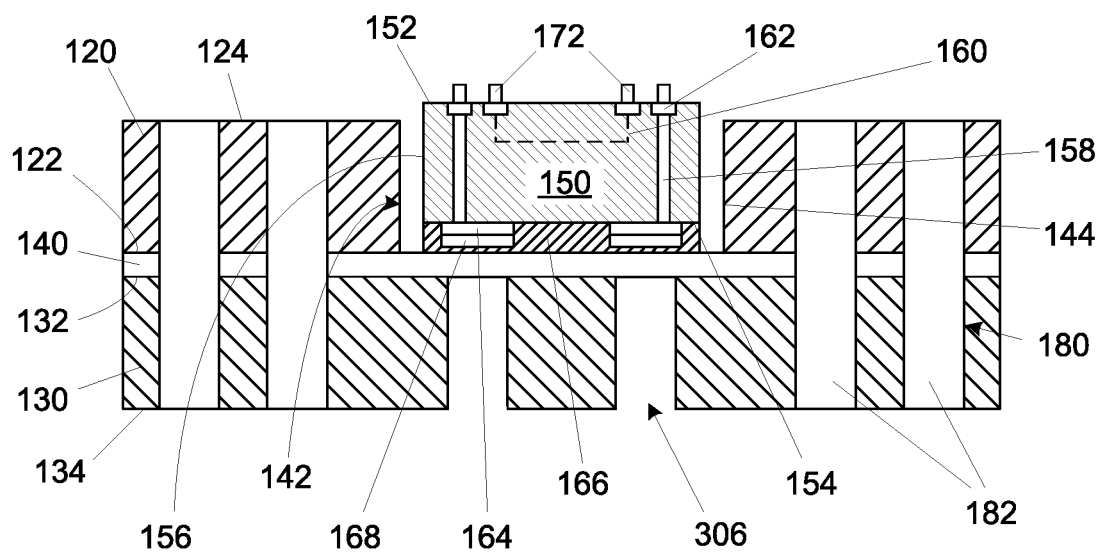
Figure 7:
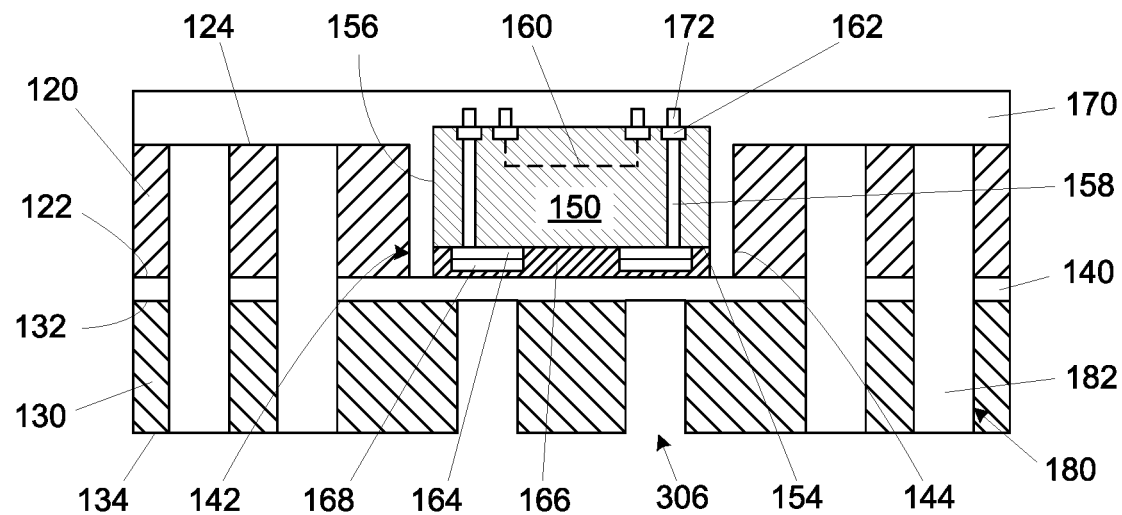

As shown in FIG. 6, the at least one bridge 150 may be disposed within the bridge opening 142 and attached to the etch stop layer 140 with the adhesive layer 166, as previously discussed. It is noted that the high-density through-mold conductive vias 172 may be formed on the bridge 150 prior to the disposition thereof in the bridge opening 142. As shown in FIG. 7, the mold material 170 may be deposited over the second surface 124 of the second glass layer 120 and the bridge 150. In one embodiment of the present description, a portion of the mold material 170 may extend into the opening 142.

Figure 8:
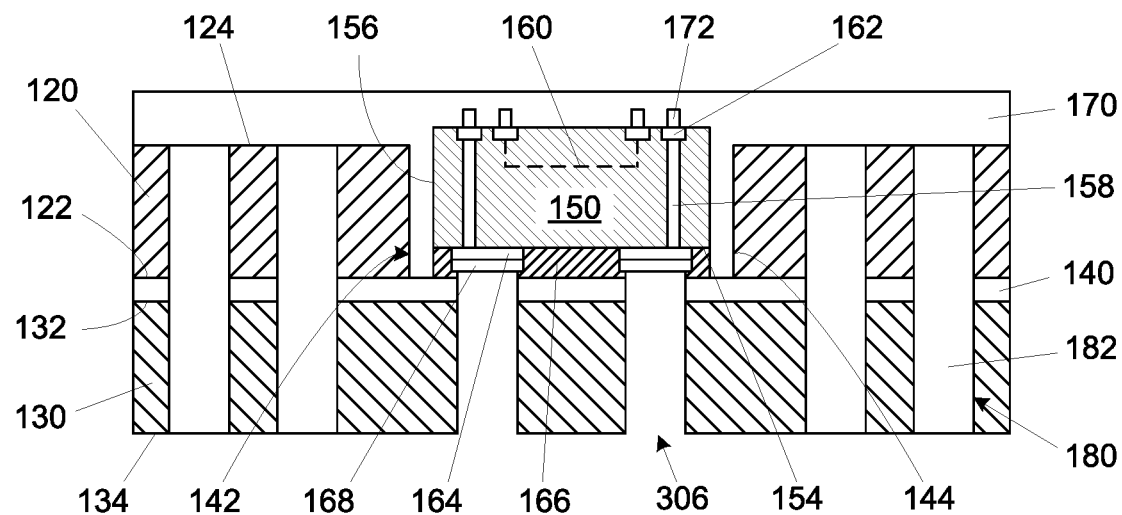
Figure 9:
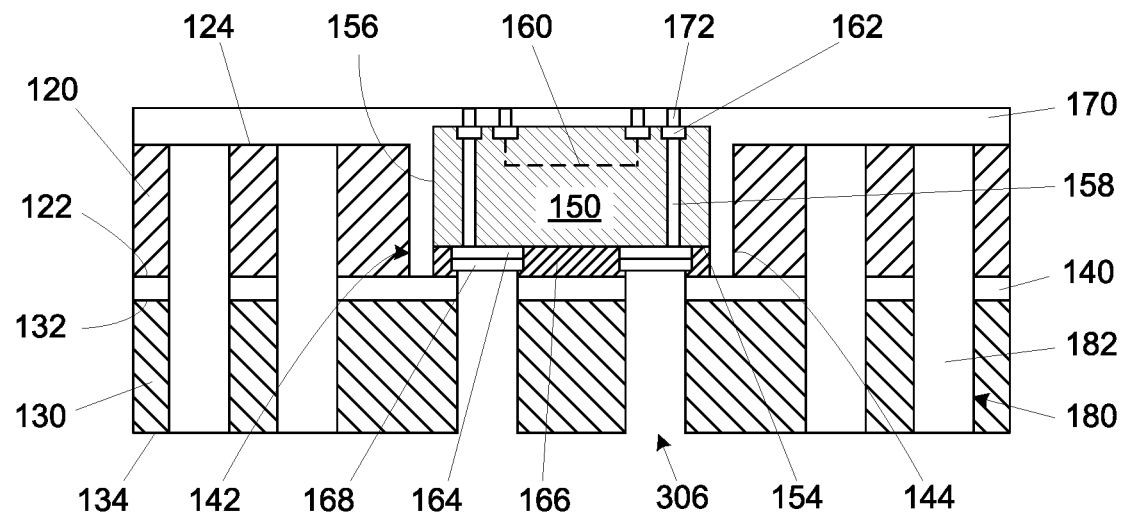
Figure 10:
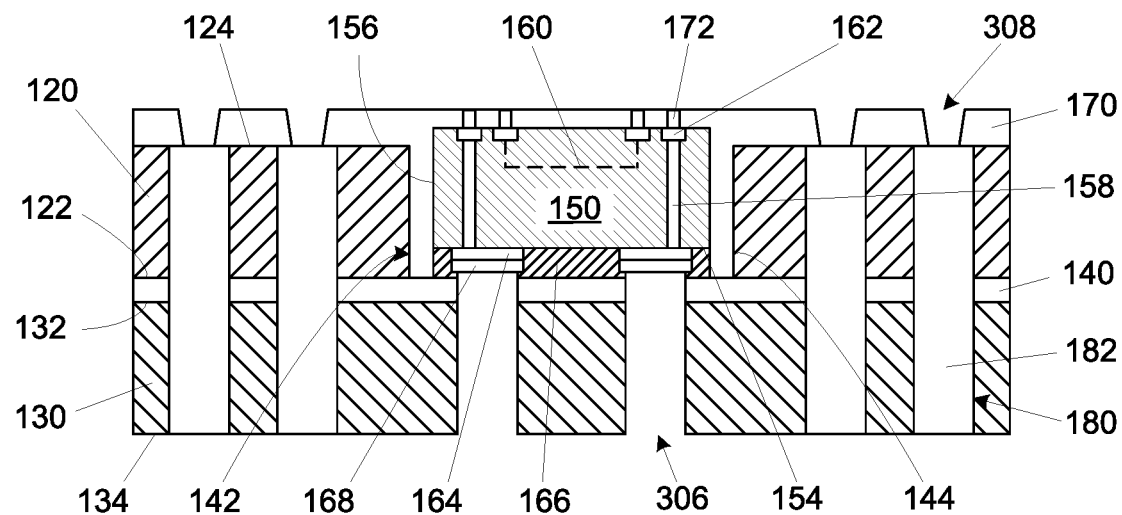

As shown in FIG. 8, the openings 306 may be extended by etching through the etch stop layer 140 and the adhesive layer 166 to expose the interconnection layers 168 of the bridge 150, as previously discussed. As shown in FIG. 9, the mold material 170 may be planarized, such as by chemical mechanical polishing, to expose the high-density through-mold conductive vias 172 of the bridge 150. As shown in FIG. 10, at least one through-mold opening 308 may be formed, such as by etching, through the mold material 170 to expose at least a portion of each first through-glass conductive via 182.

Figure 11:
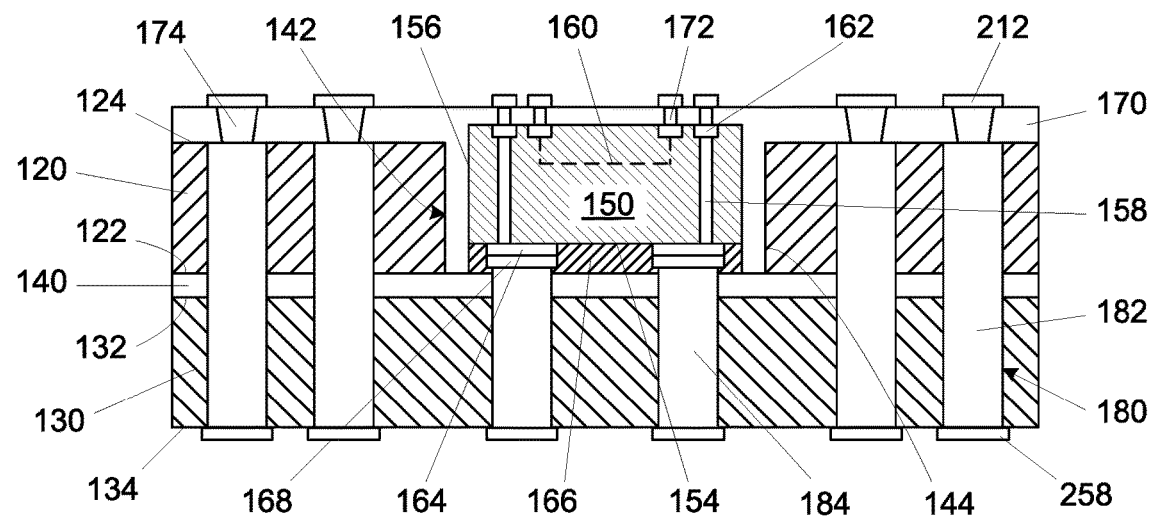
Figure 12:
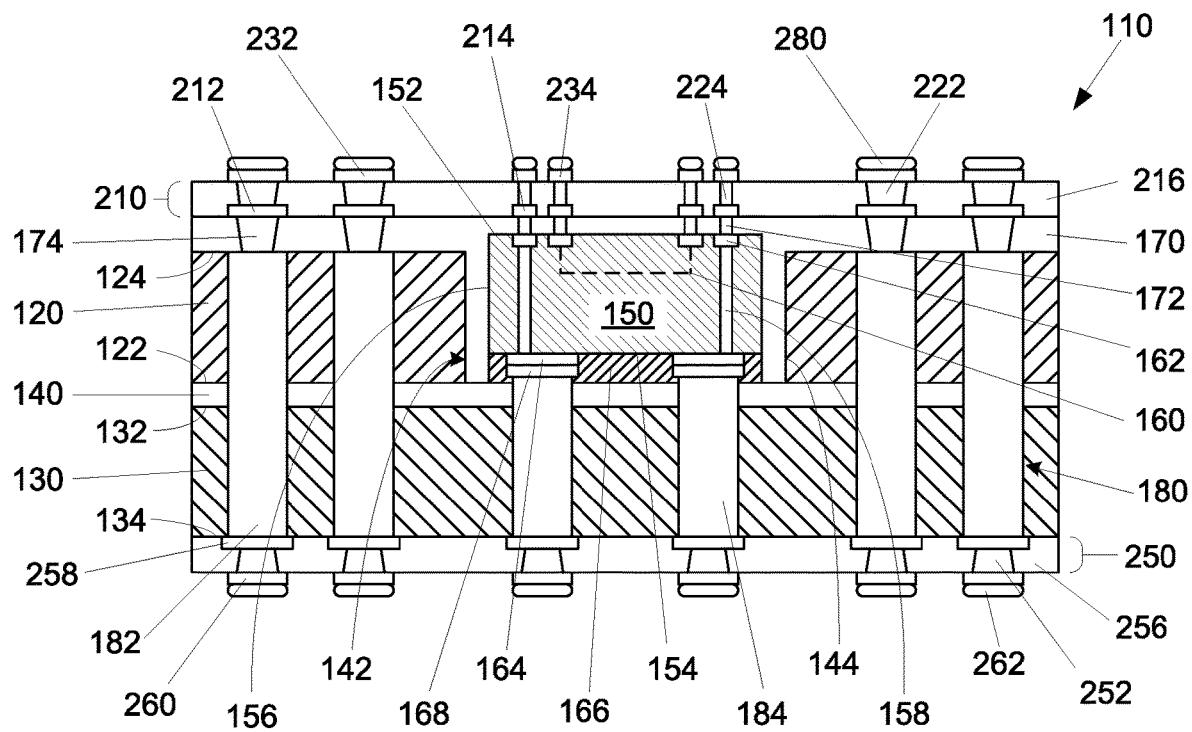

As shown in FIG. 11, the through-mold openings 308 and the openings 306 in the second glass layer 120 may be simultaneously filled with a conductive material to form the through-mold conductive via 174 and the second through-glass conductive via 184, respectively. As further shown in FIG. 11, the conductive traces 212 may be formed on the through-mold conductive via 174 and the conductive traces 258 may be formed on the first through-glass conductive via 182 and the second through-glass conductive via 184. As shown in FIG. 12, the first signal routing layer 210 and the second signal routing layer 250 may be formed, as previously discussed, to form the electronic substrate 110.

Figure 13:
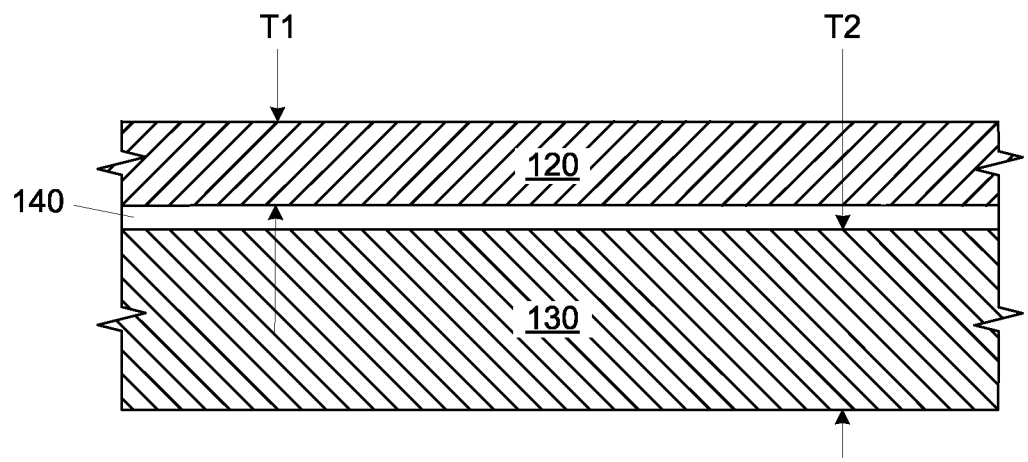
FIG. 13 is a side cross-sectional view of a glass layer stack-up, according to an embodiment of the present description.
Figure 14:
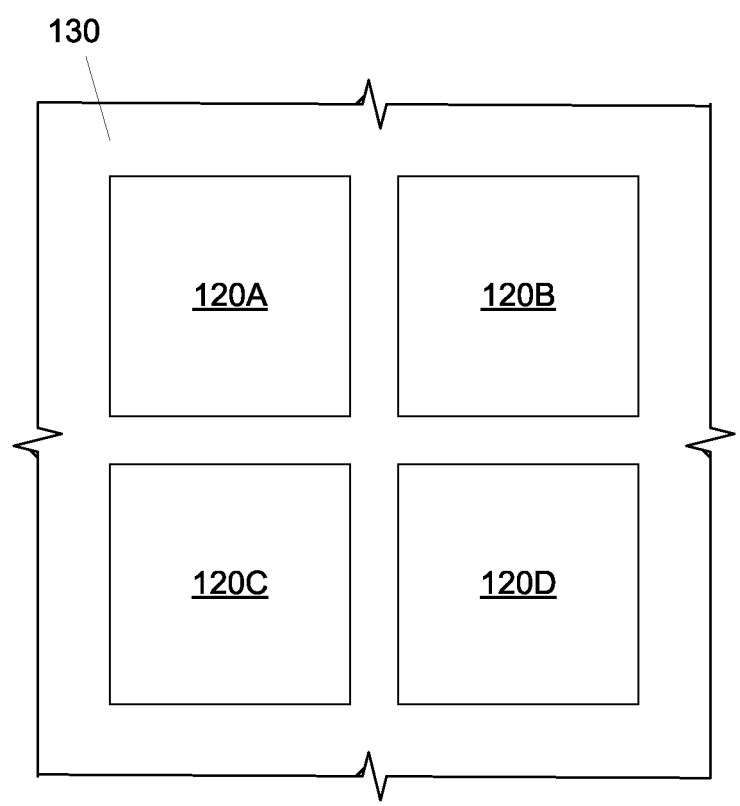
FIG. 14 is a top plan view of a glass layer configuration, according to another embodiment of the present description.

Although the embodiments shown in FIGS. 1-12 illustrate the first glass layer 120 and the second glass layer 130 as having substantially similar thicknesses, the embodiments of the present description are not so limited. For example, in FIG. 13, the first glass layer 120 may have a thickness T1 that is less than the thickness T2 of the second glass layer 130. As will be understood, a thicker second glass layer 130 may reduce warpage. Furthermore, the first glass layer 120 and the second glass layer 130 may have different form factors. For example, as shown in FIG. 14, the first glass layer (illustrated as elements 120A, 120B, 120C, and 120D) may be quarter panels bonded to a full panel, second glass layer 130.

Figure 15:
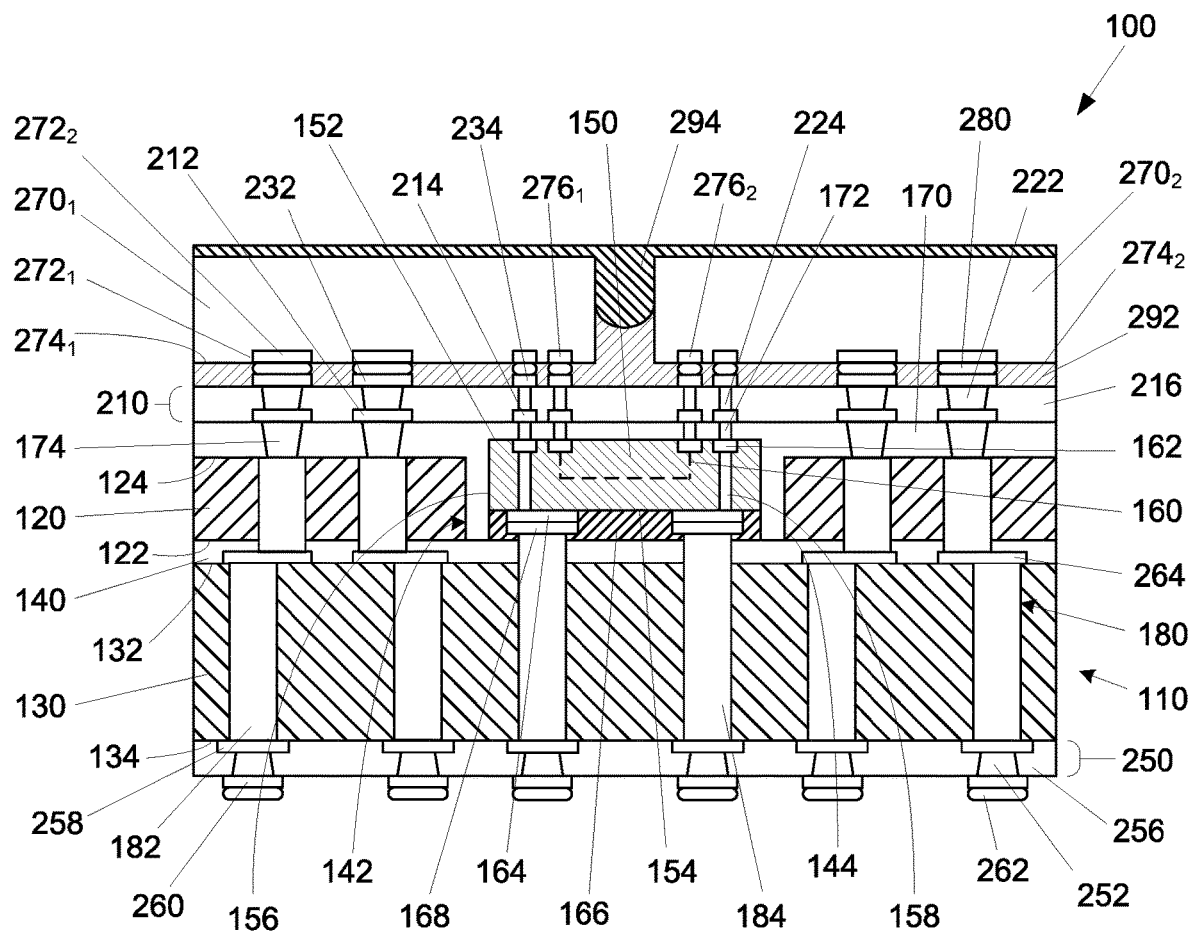
FIG. 15 is a side cross-sectional view of an integrated circuit package, according to a further embodiment of the present description.

In another embodiment of the present description, as shown in FIG. 15, the process of fabrication may allow for the fabrication of inter-glass conductive traces 264 within the etch stop layer 140. Thus, the embodiment illustrated in FIG. 15 contains all of the components of the embodiment illustrated in FIG. 1 with the exception that each through-glass conductive route 180 comprises a conductive route second portion 284 extending through the first glass layer 120, a conductive route first portion 282 extending through the second glass layer 130, and the associated inter-glass conductive trace 264.

Figure 16:
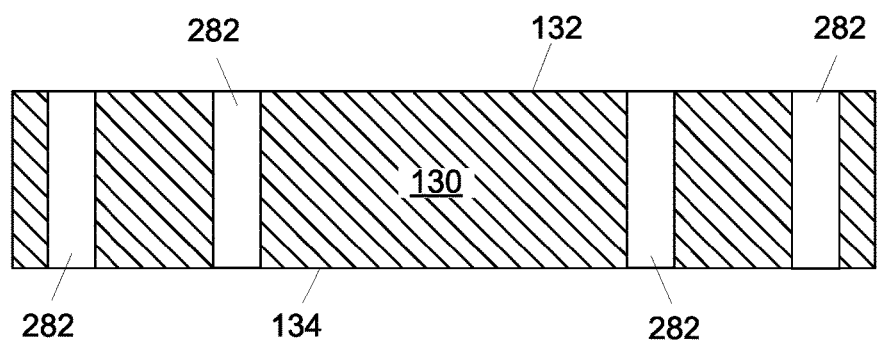
FIGS. 16-31 are side cross-sectional views of a process for fabrication an electronic substrate, according to another embodiment of the present description.
Figure 17:
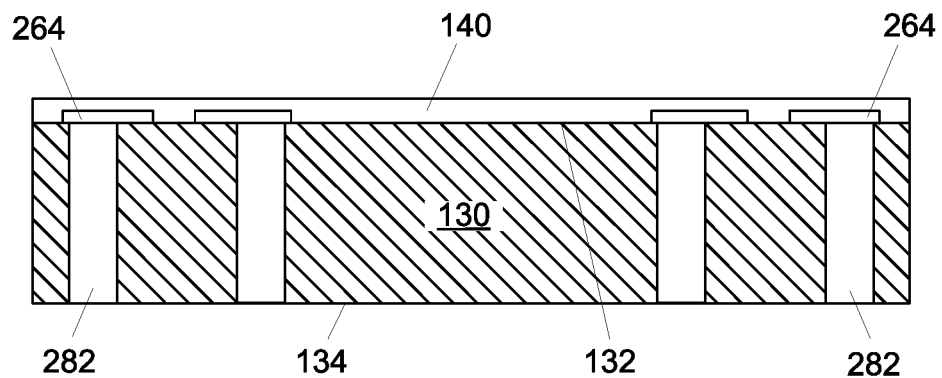

FIGS. 16-31 illustrate one embodiment of the fabrication of the electronic substrate 110 of FIG. 15. As illustrated in FIG. 16, the second glass layer 130 having at least one conductive route first portion 282 extending from the first surface 132 to the second surface 134 of the second glass layer 130 may be formed. The conductive route first portions 282 may be formed by any method known in the art, including but not limited to etching openings through the second glass layer 130, such as with an LIDE process, follow by filling the opening with a conductive material, such as plating of a metal therein. As shown in FIG. 17, at least one inter-glass conductive trace 264 may be formed on the first surface 132 of the second glass layer 130 wherein each inter-glass conductive trace 264 may be electrically attached to a corresponding conductive route first portion 282. The inter-glass conduction traces 264 may be fan-out traces, as known in the art. As further shown in FIG. 17, the etch stop layer 140 may be formed over the inter-glass conductive traces 264 and the first surface 132 of the second glass layer 130. In one embodiment, the etch stop layer 140 may have more than one layer, such as a dielectric material layer adjacent the inter-glass conductive traces 264 with a etch resist/light absorption layer on the dielectric layer. As will be understood, the inter-glass conductive traces 264 may enable relaxed mid-level interconnect pitch.

Figure 18:
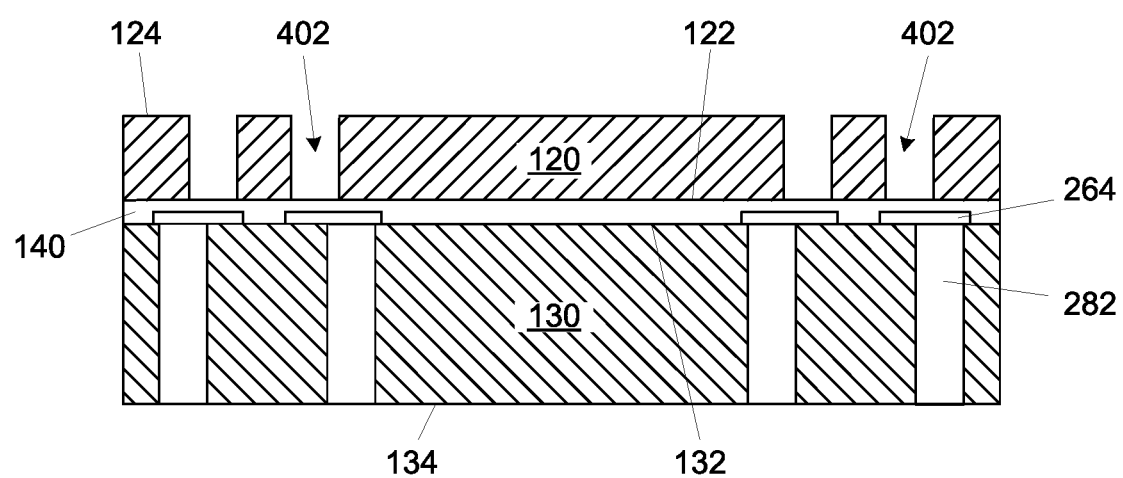

As shown in FIG. 18, the first glass layer 120 may be attached to the etch stop layer 140 and at least one opening 402 may be formed in the first glass layer 120, wherein the at least one opening 402 may extend from the second surface 124 of the first glass layer 120 to the first surface 122 of the first glass layer 120 to expose a portion of the etch stop layer 140. The openings 402 may be formed by any known process, including, but not limited to, an LIDE process, as previously discussed.

Figure 19:
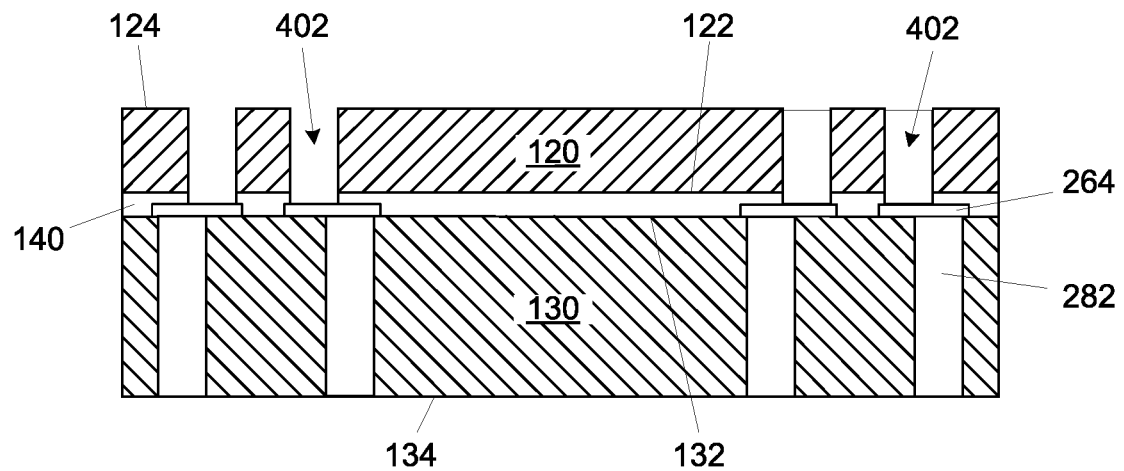
Figure 20:
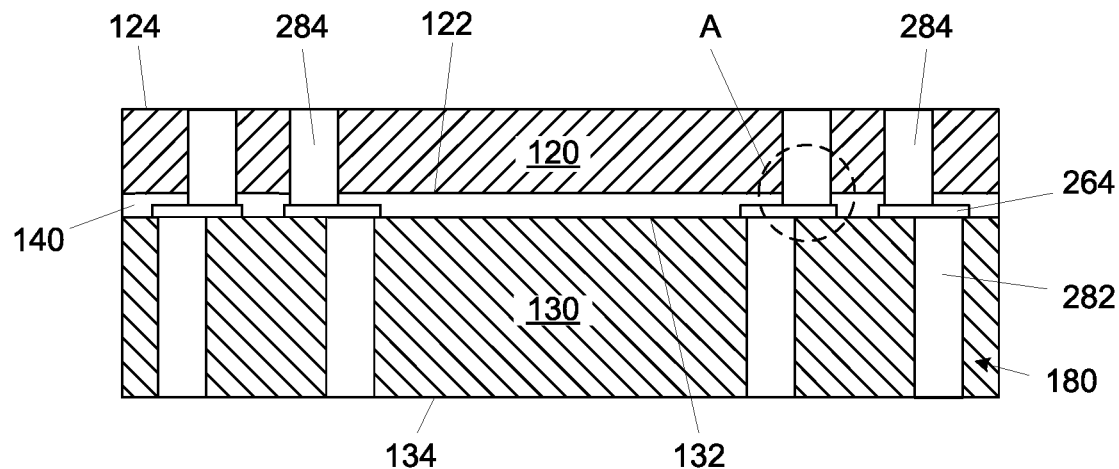

As shown in FIG. 19, the openings 402 may be extended by etching, such as dry etching, through the etch stop layer 140 to expose a portion of corresponding inter-glass conductive traces 264. As shown in FIG. 20, the openings 402 (see FIG. 19) in the first glass layer 120 may be filled with a conductive material to form at least one conductive route second portion 284. Thus, each through-glass conductive route 180 may comprise a combination of a corresponding conductive route second portion 284, a corresponding inter-glass conductive trace 264, and a corresponding conductive route first portion 282.

Figure 21:
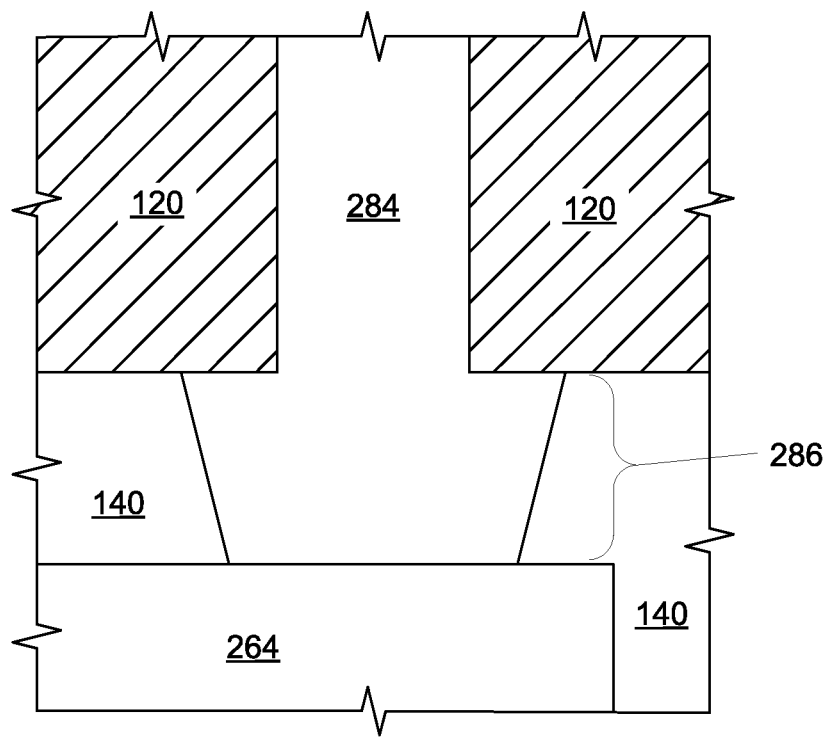

As shown in FIG. 21, which is a close-up of inset A of FIG. 20, etching though the etch stop layer 140, as shown in FIG. 19, may result an undercut having a substantially sloped profile, such that the conductive route second portion 284 may have a flange 286 adjacent the inter-glass conductive trace 264.

Figure 22:
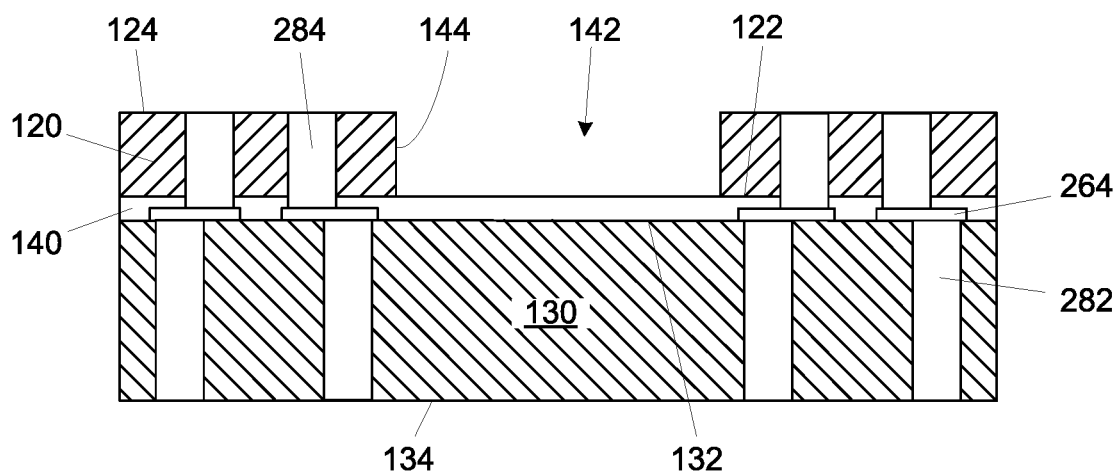
Figure 23:
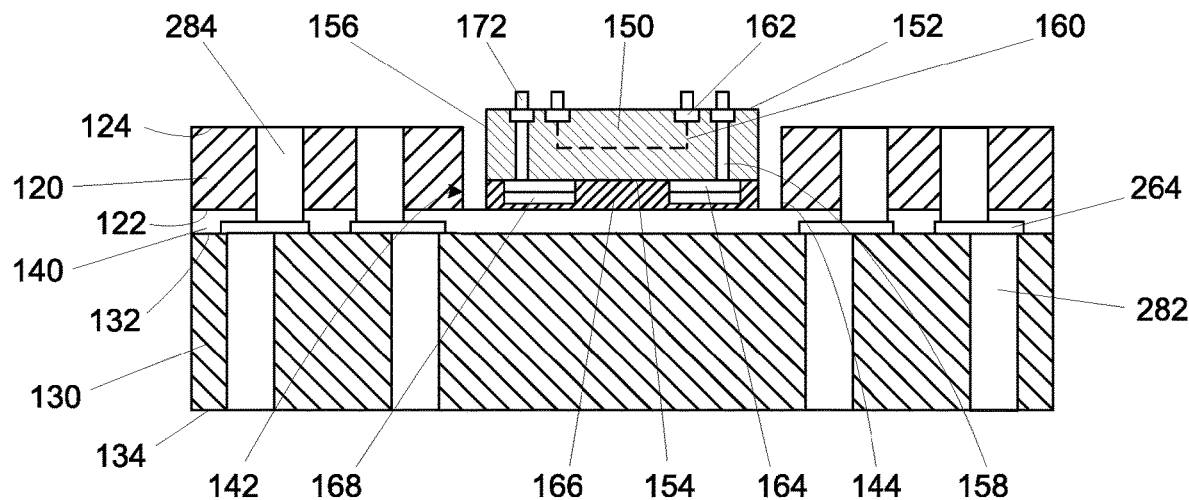
Figure 24:
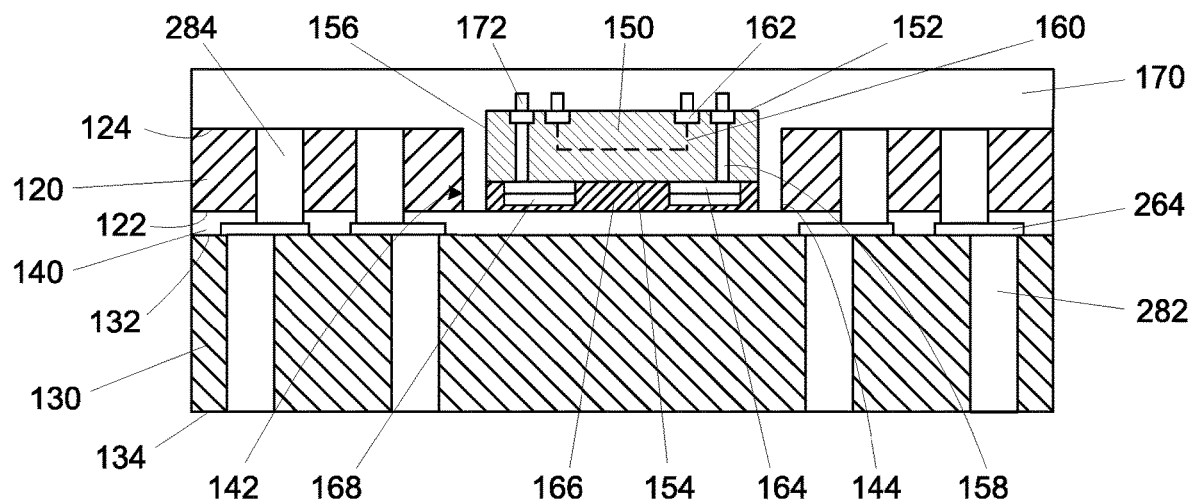

As shown in FIG. 22, the bridge opening 142 may be formed in the second glass layer 130, as previously discussed, which exposes a portion of the etch stop 140. As shown in FIG. 23, the at least one bridge 150 may be disposed within the bridge opening 142 and attached to the etch stop layer 140 with the adhesive layer 166, as previously discussed. As shown in FIG. 24, the mold material 170 may be deposited over the second surface 124 of the second glass layer 120 and the bridge 150. In one embodiment of the present description, a portion of the mold material 170 may extend into the bridge opening 142. It is noted that the high-density through-mold conductive vias 172 may be formed on the bridge 150 prior to the disposition thereof in the bridge opening 142.

Figure 25:
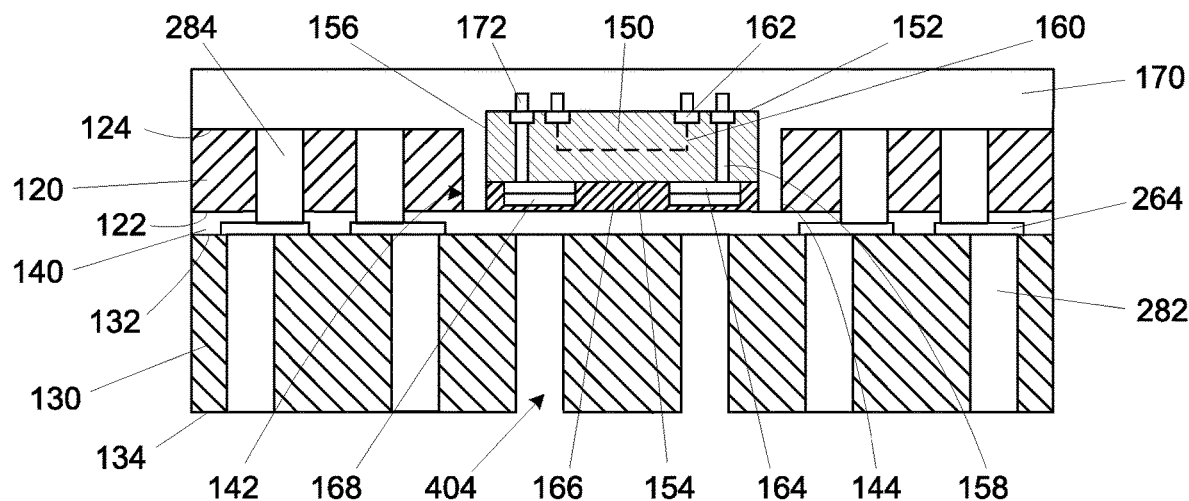
Figure 26:
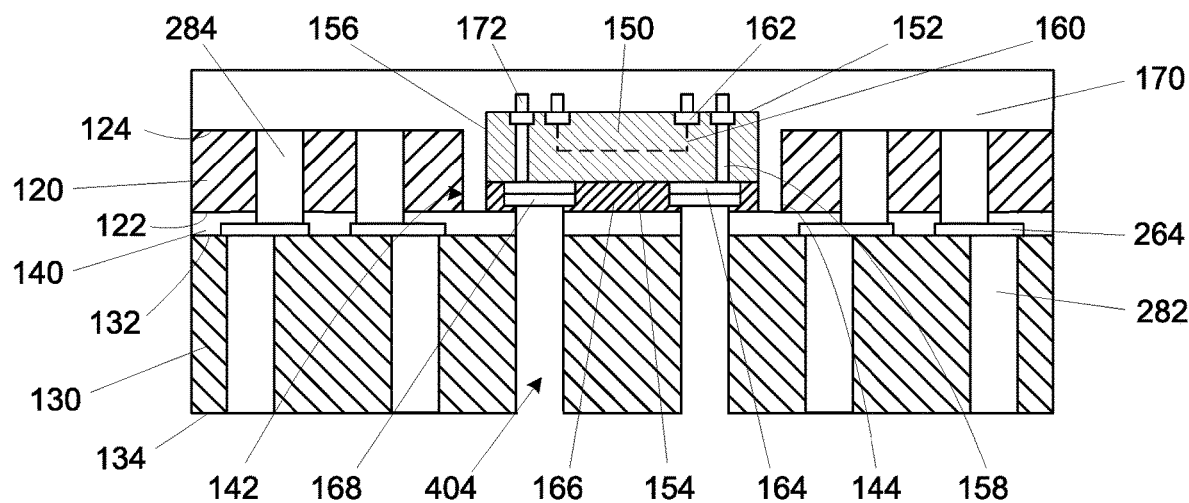
Figure 27:
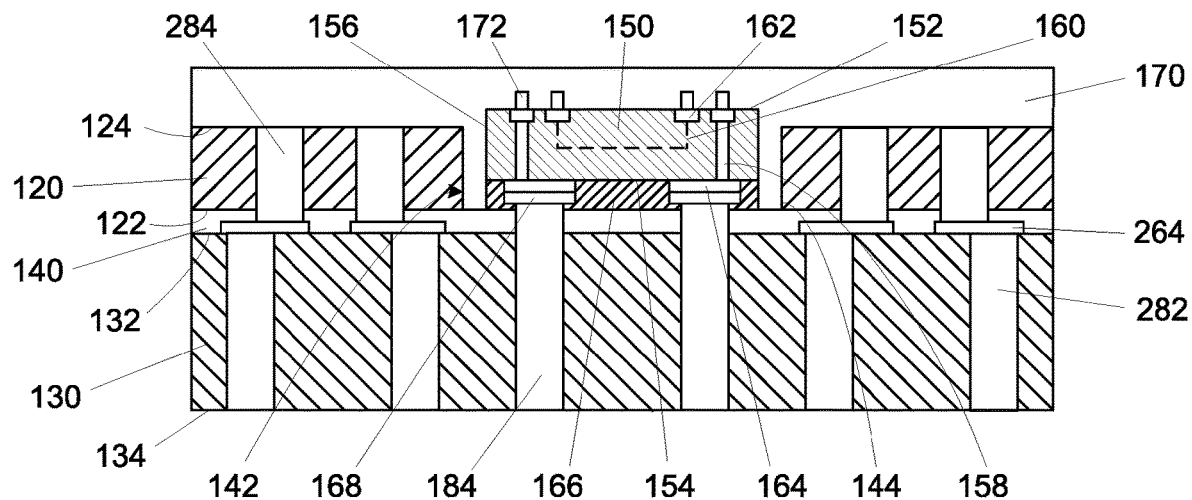

As shown in FIG. 25, at least one opening 404 may be formed through the second glass layer 130, wherein the at least one opening 404 may extend from the second surface 134 of the second glass layer 130 to the first surface 132 of the second glass layer 130 to expose a portion of the etch stop layer 140. The openings 404 in the second glass layer 130 may be formed to align with corresponding bond pads 164 and interconnection layers 168 at the second surface 154 of the bridge 150. As shown in FIG. 26, the openings 404 may be extended by etching through the etch stop layer 140 and the adhesive layer 166 to expose the interconnection layer 168 of the bridge 150, as previously discussed. As shown in FIG. 27, the openings 404 (see FIG. 26) in the second glass layer 130 may be filled with a conductive material to form the second through-glass conductive via 184.

Figure 28:
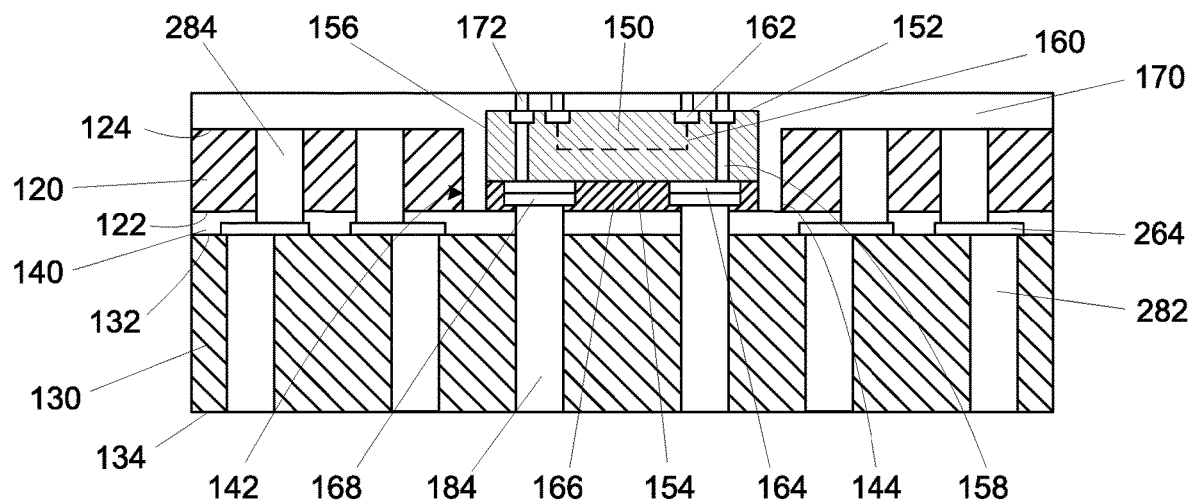
Figure 29:
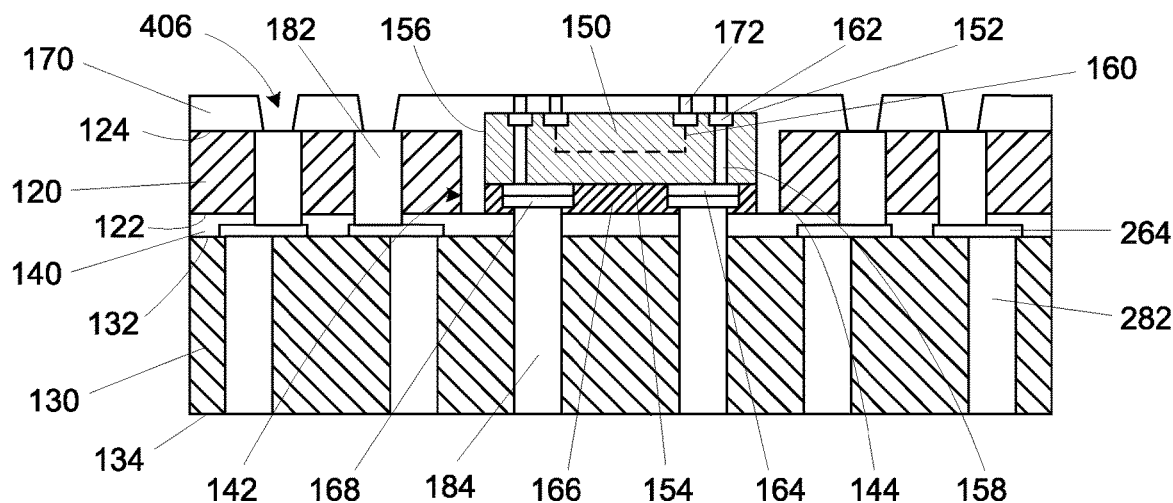

As shown in FIG. 28, the mold material 170 may be planarized, such as by chemical mechanical polishing, to expose the high-density through-mold conductive vias 172 of the bridge 150. As shown in FIG. 29, at least one through-mold opening 406 may be formed, such as by etching, through the mold material 170 to expose at least a portion of each conductive route second portion 284.

Figure 30:
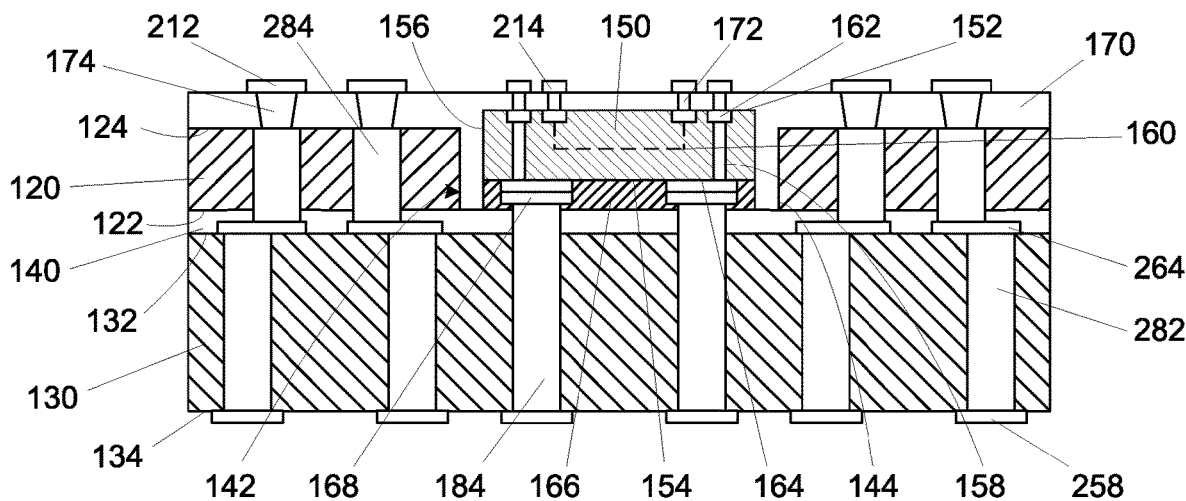
Figure 31:
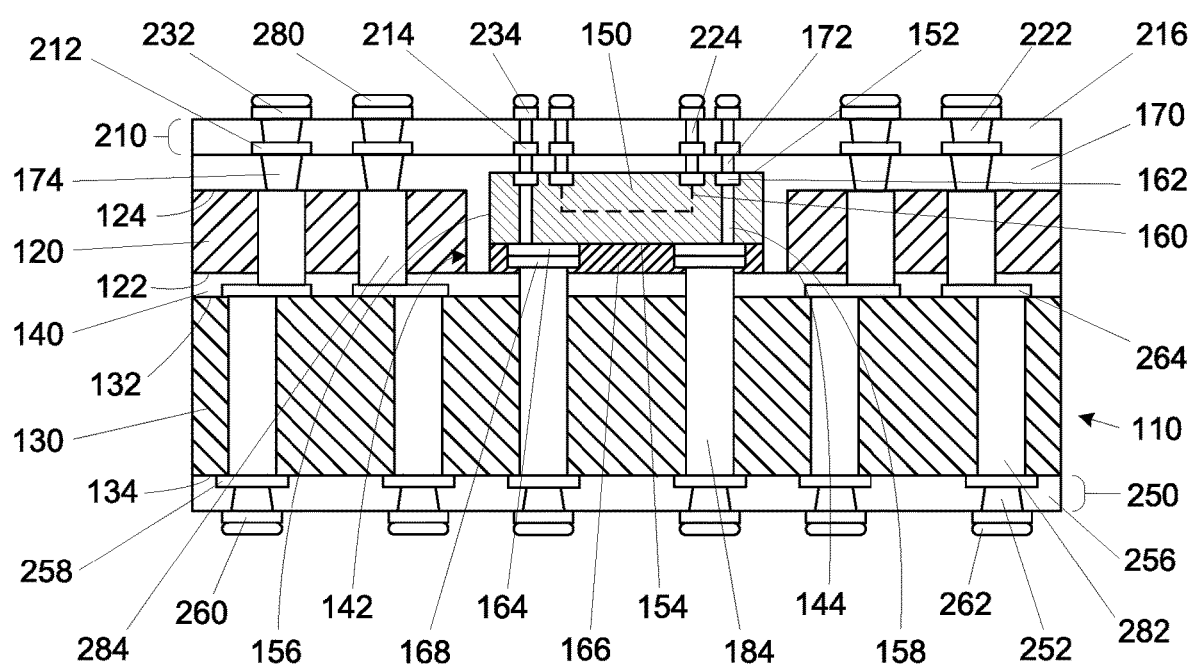

As shown in FIG. 30, the through-mold openings 406 may be filled with a conductive material to form the through-mold conductive vias 174. As shown in FIG. 31, the conductive traces 212 may be formed on the through-mold conductive vias 174 and the conductive traces 258 may be formed on the conductive route first portion 282 and the second through-glass conductive vias 184. As shown in FIG. 31, the first signal routing layer 210 and the second signal routing layer 250 may be formed, as previously discussed, to form the electronic substrate 110.

Figure 32:
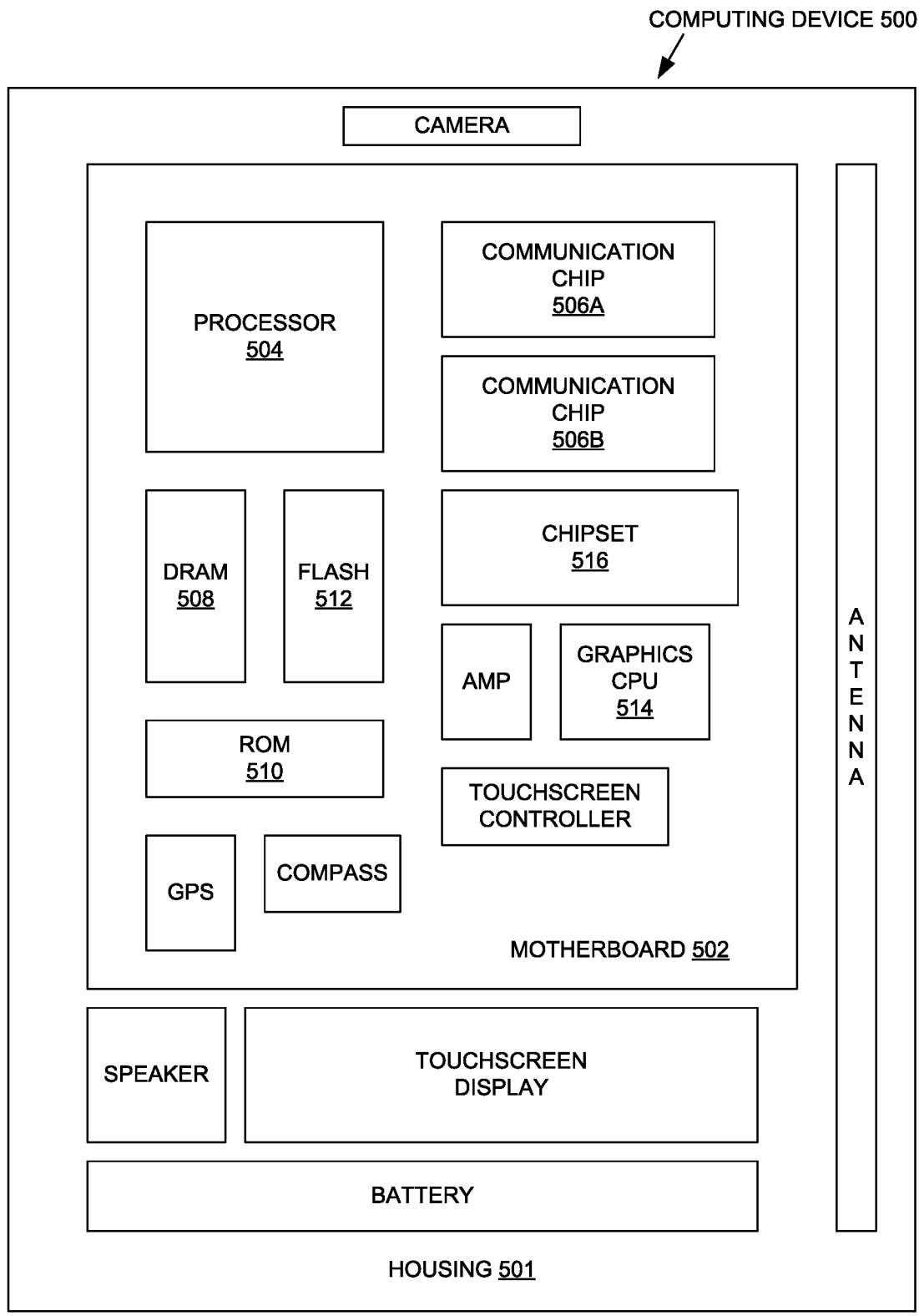
FIG. 32 is an electronic system, according to one embodiment of the present description.

FIG. 32 illustrates an electronic or computing device 500 in accordance with one implementation of the present description. The computing device 500 may include a housing 501 having a board 502 disposed therein. The computing device 500 may include a number of integrated circuit components, including but not limited to a processor 504, at least one communication chip 506A, 506B, volatile memory 508 (e.g., DRAM), non-volatile memory 510 (e.g., ROM), flash memory 512, a graphics processor or CPU 514, a digital signal processor (not shown), a crypto processor (not shown), a chipset 516, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 502. In some implementations, at least one of the integrated circuit components may be a part of the processor 504.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an integrated circuit package including an electronic substrate comprising a first glass layer having a first surface and an opposing second surface, a second glass layer having a first surface and an opposing second surface, and an etch stop layer abutting the first surface of the first glass layer and abutting the first surface of the second glass layer, wherein the first glass layer includes an opening extending from the first surface of the first glass layer at the etch stop layer to the second surface of the first glass layer.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-32. The subject matter may be applied to other integrated circuit devices and assembly applications, as well as any appropriate electronic application, as will be understood to those skilled in the art.

The follow examples pertain to further embodiments and specifics in the examples may be used anywhere in one or more embodiments, wherein Example 1 is an apparatus comprising a first glass layer having a first surface and an opposing second surface, a second glass layer having a first surface and an opposing second surface, and an etch stop layer abutting the first surface of the first glass layer and abutting the first surface of the second glass layer, wherein the first glass layer includes an opening extending from the first surface of the first glass layer at the etch stop layer to the second surface of the first glass layer.

In Example 2, the subject matter of Example 1 can optionally include the etch stop layer comprising a light absorbing material.

In Example 3, the subject matter of any of Examples 1 to 2 can optionally include a bridge disposed with the opening of the first glass layer, wherein the bridge is attached to the etch stop layer.

In Example 4, the subject matter of Example 3 can optionally include a through-glass conductive via extending through the second glass layer and the etch stop layer, wherein the through-glass conductive via is electrically attached to the bridge.

In Example 5, the subject matter of any of Examples 3 and 4 can optionally include the bridge including at least one through-bridge conductive via.

In Example 6, the subject matter of Example 3 to 5 can optionally include the bridge including at least one interconnection route.

In Example 7, the subject matter of any of Examples 1 to 6 can optionally include at least one conductive route extending from the second surface of the first glass layer to the second surface of the second glass layer.

In Example 8, the subject matter of Example 7 can optionally include the at least one conductive route comprising an inter-glass conductive trace within the etch stop layer, a conductive route first portion extending through the second glass layer and electrically attached to the inter-glass conductive trace, and a conductive route second portion extending through the first glass layer and electrically attached to the inter-glass conductive trace.

Example 9 is an apparatus comprising an electronic substrate, wherein the electronic substrate comprises a first glass layer having a first surface and an opposing second surface, a second glass layer having a first surface and an opposing second surface, an etch stop layer abutting the first surface of the first glass layer and abutting the first surface of the second glass layer, wherein the first glass layer includes an opening extending from the first surface of the first glass layer at the etch stop layer to the second surface of the first glass layer, and a bridge disposed with the opening of the first glass layer, wherein the bridge is attached to the etch stop layer; and at least one integrated circuit device electrically attached to the electronic substrate.

In Example 10, the subject matter of Example 9 can optionally include the etch stop layer comprising a light absorbing material.

In Example 11, the subject matter of any of Examples 9 to 10 can optionally include at least one conductive route extending from the second surface of the first glass layer to the second surface of the second glass layer.

In Example 12, the subject matter of Example 11 can optionally include the at least one conductive route comprising an inter-glass conductive trace within the etch stop layer, a conductive route first portion extending through the second glass layer and electrically attached to the inter-glass conductive trace, and a conductive route second portion extending through the first glass layer and electrically attached to the inter-glass conductive trace.

In Example 13, the subject matter of any of Examples 9 to 12 can optionally include a through-glass conductive via extending through the second glass layer and the etch stop layer, wherein the through-glass conductive via is electrically attached to the bridge.

In Example 14, the subject matter of Example 13 can optionally include the bridge including a through-bridge conductive via and wherein the through-glass conductive via is electrically attached to the through-bridge conductive via.

In Example 15, the subject matter of any of Examples 9 to 14 can optionally include the bridge including at least one interconnection route, wherein the at least one integrated circuit device comprises a first integrated circuit device and a second integrated circuit device, and the at least one interconnection route electrically couples the first integrated circuit device and a second integrated circuit device.

Example 16 is an electronic system, comprising a board and an integrated circuit package electrically attached to the board, wherein the integrated circuit package comprises an electronic substrate, wherein the electronic substrate comprises a first glass layer having a first surface and an opposing second surface; a second glass layer having a first surface and an opposing second surface; an etch stop layer abutting the first surface of the first glass layer and abutting the first surface of the second glass layer, wherein the first glass layer includes an opening extending from the first surface of the first glass layer at the etch stop layer to the second surface of the first glass layer; a bridge disposed with the opening of the first glass layer, wherein the bridge is attached to the etch stop layer and wherein the bridge include at least one interconnection route; a plurality conductive routes extending from the second surface of the first glass layer to the second surface of the second glass layer; and a first integrated circuit device electrically attached to one conductive route of the plurality of conductive routes of the electronic substrate and the at least one interconnection route of the electronic substrate; and a second integrated circuit device electrically attached to the electronic substrate attached to another conductive route of the plurality of conductive routes of the electronic substrate and the at least one interconnection route of the electronic substrate, wherein the at least one interconnection route electrically connects the first integrated circuit device and a second integrated circuit device.

In Example 17, the subject matter of Example 16 can optionally include the etch stop layer comprising a light absorbing material.

In Example 18, the subject matter of any of Example 16 to 17 can optionally include the at least one conductive route comprises an inter-glass conductive trace within the etch stop layer, a conductive route first portion extending through the second glass layer and electrically attached to the inter-glass conductive trace, and a conductive route second portion extending through the first glass layer and electrically attached to the inter-glass conductive trace.

In Example 19, the subject matter of any of Examples 14 to 16 can optionally include a through-glass conductive via extending through the second glass layer and the etch stop layer, wherein the through-glass conductive via is electrically attached to the bridge.

In Example 20, the subject matter of Example 19 can optionally include the bridge including at least one through-bridge conductive via and wherein the through-glass conductive via and wherein the through=glass conductive via is electrically attached to the through-bridge conductive via.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An apparatus, comprising:
   a first glass layer having a first surface and an opposing second surface;
   a second glass layer having a first surface and an opposing second surface;
   an etch stop layer abutting the first surface of the first glass layer and abutting the first surface of the second glass layer, wherein the first glass layer comprises an opening extending from the first surface of the first glass layer at the etch stop layer to the second surface of the first glass layer;
   a bridge within the opening of the first glass layer, wherein the bridge is attached to the etch stop layer; and
   a through-glass conductive via extending through the second glass layer and the etch stop layer, wherein the through-glass conductive via is electrically attached to the bridge.

2. The apparatus of claim 1, wherein the etch stop layer comprises a light absorbing material.

3. The apparatus of claim 1, wherein the etch stop layer comprises one of a polymer or a metal oxide.

4. The apparatus of claim 1, wherein the bridge comprises a through-bridge conductive via and wherein the through-glass conductive via is electrically attached to the through-bridge conductive via.

5. The apparatus of claim 1, further comprising at least one conductive route extending from the second surface of the first glass layer to the second surface of the second glass layer.

6. The apparatus of claim 1, further comprising:
   an electronic substrate comprising the first glass layer, the second glass layer, and the etch stop layer; and
   an integrated circuit device and/or a board electrically attached to the electronic substrate.

7. An apparatus, comprising:
   a first glass layer having a first surface and an opposing second surface;
   a second glass layer having a first surface and an opposing second surface;
   a layer abutting the first surface of the first glass layer and abutting the first surface of the second glass layer, wherein the layer comprises one of a polymer or a metal oxide, and wherein the first glass layer comprises an opening extending from the first surface of the first glass layer to the second surface of the first glass layer;
   a bridge within the opening of the first glass layer, wherein the bridge is attached to the layer; and
   a through-glass conductive via extending through the second glass layer and the layer, wherein the through-glass conductive via is electrically attached to the bridge.

8. The apparatus of claim 7, wherein the layer comprises the metal oxide, the metal oxide comprising aluminum and oxygen.

9. The apparatus of claim 7, wherein the layer comprises the polymer, the polymer comprising one of polytetrafluoroethylene, polyethylene, polyvinyl chloride, polyvinylidene fluoride, or ultra-high molecular weight polyethylene.

10. The apparatus of claim 7, wherein the bridge comprises a through-bridge conductive via and wherein the through-glass conductive via is electrically attached to the through-bridge conductive via.

11. The apparatus of claim 7, further comprising at least one conductive route extending from the second surface of the first glass layer to the second surface of the second glass layer.

12. The apparatus of claim 7, further comprising:
   an electronic substrate comprising the first glass layer, the second glass layer, the layer; and
   an integrated circuit device and/or a board electrically attached to the electronic substrate.

13. An apparatus, comprising:
   a first glass layer having a first surface and an opposing second surface;
   a second glass layer having a first surface and an opposing second surface;
   an etch stop layer abutting the first surface of the first glass layer and abutting the first surface of the second glass layer, wherein the first glass layer comprises an opening extending from the first surface of the first glass layer at the etch stop layer to the second surface of the first glass layer; and
   at least one conductive route extending from the second surface of the first glass layer to the second surface of the second glass layer.

14. The apparatus of claim 13, wherein the etch stop layer comprises a light absorbing material.

15. The apparatus of claim 13, wherein the etch stop layer comprises one of a polymer or a metal oxide.

16. The apparatus of claim 13, further comprising a bridge disposed with the opening of the first glass layer, wherein the bridge is attached to the etch stop layer.

17. The apparatus of claim 13, wherein the at least one conductive route comprises an inter-glass conductive trace within the etch stop layer, a conductive route first portion extending through the second glass layer and electrically attached to the inter-glass conductive trace, and a conductive route second portion extending through the first glass layer and electrically attached to the inter-glass conductive trace.

18. The apparatus of claim 13, further comprising:
   an electronic substrate comprising the first glass layer, the second glass layer, and the etch stop layer; and an integrated circuit device and/or a board electrically attached to the electronic substrate.

19. An apparatus, comprising:
a first glass layer having a first surface and an opposing second surface;
a second glass layer having a first surface and an opposing second surface;
a layer abutting the first surface of the first glass layer and abutting the first surface of the second glass layer, wherein the layer comprises one of a polymer or a metal oxide, and wherein the first glass layer comprises an opening extending from the first surface of the first glass layer to the second surface of the first glass layer; and
at least one conductive route extending from the second surface of the first glass layer to the second surface of the second glass layer.

20. The apparatus of claim 19, wherein the layer comprises the metal oxide, the metal oxide comprising aluminum and oxygen.

21. The apparatus of claim 19, wherein the layer comprises the polymer, the polymer comprising one of polytetrafluoroethylene, polyethylene, polyvinyl chloride, polyvinylidene fluoride, or ultra-high molecular weight polyethylene.

22. The apparatus of claim 19, further comprising a bridge disposed with the opening of the first glass layer, wherein the bridge is attached to the layer.

23. The apparatus of claim 19, wherein the at least one conductive route comprises an inter-glass conductive trace within the layer, a conductive route first portion extending through the second glass layer and electrically attached to the inter-glass conductive trace, and a conductive route second portion extending through the first glass layer and electrically attached to the inter-glass conductive trace.

24. The apparatus of claim 19, further comprising:
an electronic substrate comprising the first glass layer, the second glass layer, and the layer; and
at least one integrated circuit device electrically attached to the electronic substrate.

* * * * *